US010236204B2

(12) United States Patent
Engelhardt

(10) Patent No.: US 10,236,204 B2
(45) Date of Patent: Mar. 19, 2019

(54) SEMICONDUCTOR PROCESSING SYSTEM

(71) Applicant: Infineon Technologies AG, Neubiberg (DE)

(72) Inventor: Manfred Engelhardt, Villach-Landskron (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 140 days.

(21) Appl. No.: 15/184,804

(22) Filed: Jun. 16, 2016

(65) Prior Publication Data

US 2016/0293474 A1  Oct. 6, 2016

Related U.S. Application Data

(62) Division of application No. 13/305,161, filed on Nov. 28, 2011, now abandoned.

(51) Int. Cl.
| | |
|---|---|
| *H01L 21/687* | (2006.01) |
| *H01L 21/67* | (2006.01) |
| *H01L 21/683* | (2006.01) |
| *C23C 16/44* | (2006.01) |
| *C23C 16/458* | (2006.01) |
| *C23C 16/509* | (2006.01) |
| *C23C 14/34* | (2006.01) |
| *C23C 16/50* | (2006.01) |
| *H01L 21/02* | (2006.01) |
| *H01L 21/3065* | (2006.01) |

(52) U.S. Cl.
CPC ........ *H01L 21/68785* (2013.01); *C23C 14/34* (2013.01); *C23C 16/4401* (2013.01); *C23C 16/4583* (2013.01); *C23C 16/50* (2013.01); *C23C 16/5096* (2013.01); *H01L 21/02274* (2013.01); *H01L 21/3065* (2013.01); *H01L 21/67069* (2013.01); *H01L 21/6838* (2013.01)

(58) Field of Classification Search
CPC ........ H01L 21/68785; H01L 21/02274; H01L 21/3065; H01L 21/67069; H01L 21/6838; C23C 14/34; C23C 16/4401; C23C 16/4583; C23C 16/50; C23C 16/5096
See application file for complete search history.

(56) References Cited

U.S. PATENT DOCUMENTS

| | | | |
|---|---|---|---|
| 5,456,796 A | 10/1995 | Gupta et al. | |
| 5,731,130 A | 3/1998 | Tseng | |
| 6,228,439 B1 | 5/2001 | Watanabe et al. | |
| 6,271,498 B1 | 8/2001 | Miyake et al. | |
| 6,416,579 B1 | 7/2002 | Thallner | |
| 6,972,069 B2 | 12/2005 | Hecht et al. | |
| 2003/0124764 A1* | 7/2003 | Yamazaki | B05D 1/60 438/99 |

(Continued)

FOREIGN PATENT DOCUMENTS

| | | |
|---|---|---|
| AT | 408930 B | 4/2002 |
| DE | 19522574 A1 | 1/1996 |

(Continued)

*Primary Examiner* — Duy Vu N Deo
(74) *Attorney, Agent, or Firm* — Slater Matsil, LLP

(57) ABSTRACT

The semiconductor processing system includes a reactor chamber that has an upper wall and a lower wall. A hold member is disposed in the reactor chamber to hold a semiconductor substrate in such a way that it faces the lower wall of the reactor chamber.

3 Claims, 5 Drawing Sheets

(56) References Cited

U.S. PATENT DOCUMENTS

| | | |
|---|---|---|
| 2003/0180495 A1 | 9/2003 | Ito et al. |
| 2004/0264044 A1 | 12/2004 | Konishi et al. |
| 2005/0016462 A1* | 1/2005 | Yamazaki ............... C23C 14/12 118/726 |
| 2005/0170263 A1 | 8/2005 | Mitsui et al. |
| 2009/0211596 A1* | 8/2009 | Yun ................... H01L 21/02063 134/6 |
| 2010/0300875 A1 | 12/2010 | Chen et al. |

FOREIGN PATENT DOCUMENTS

| | | |
|---|---|---|
| DE | 10048881 A1 | 3/2002 |
| DE | 102004063703 A1 | 7/2006 |
| EP | 0989594 A2 | 3/2000 |

* cited by examiner

SEMICONDUCTOR PROCESSING SYSTEM

CROSS-REFERENCE TO RELATED APPLICATIONS

This application is a divisional of U.S. patent application Ser. No. 13/305,161, filed Nov. 28, 2011 and entitled "Semiconductor Processing System," which application is incorporated herein by reference.

TECHNICAL FIELD

The present invention relates to a semiconductor processing system, a semiconductor processing apparatus, and a method for processing a semiconductor substrate.

BACKGROUND

In semiconductor processing technology very often films or layers are deposited onto a semiconductor substrate surface and later on selectively removed by known methods. The removal of films may result in particles, defects, flakes, etc., on the wafer, in particular in lift-off processes. It is important to reduce or even eliminate such a deposition of particles, defects, flakes, etc., as they are a potential source of defects and malfunctions of an electronic device or circuit fabricated on the semiconductor wafer.

SUMMARY

In accordance with an embodiment, a method for processing a semiconductor substrate comprises providing a reactor chamber comprising an upper wall and a lower wall and a hold member to hold a semiconductor substrate to be processed; placing the semiconductor substrate onto the hold member in such a way that it faces the lower wall of the reactor chamber; disposing a magnet outside the reactor chamber such that a pole of the magnet is facing an exposed surface of the semiconductor substrate to distract material fragments or particles released from the semiconductor substrate; and processing the semiconductor substrate including taking away one or more particles, defects and flakes that have fallen down form the semiconductor substrate due to gravitational or magnetic forces, by any sort of flowing process gas or plasma in the direction of an outlet opening.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
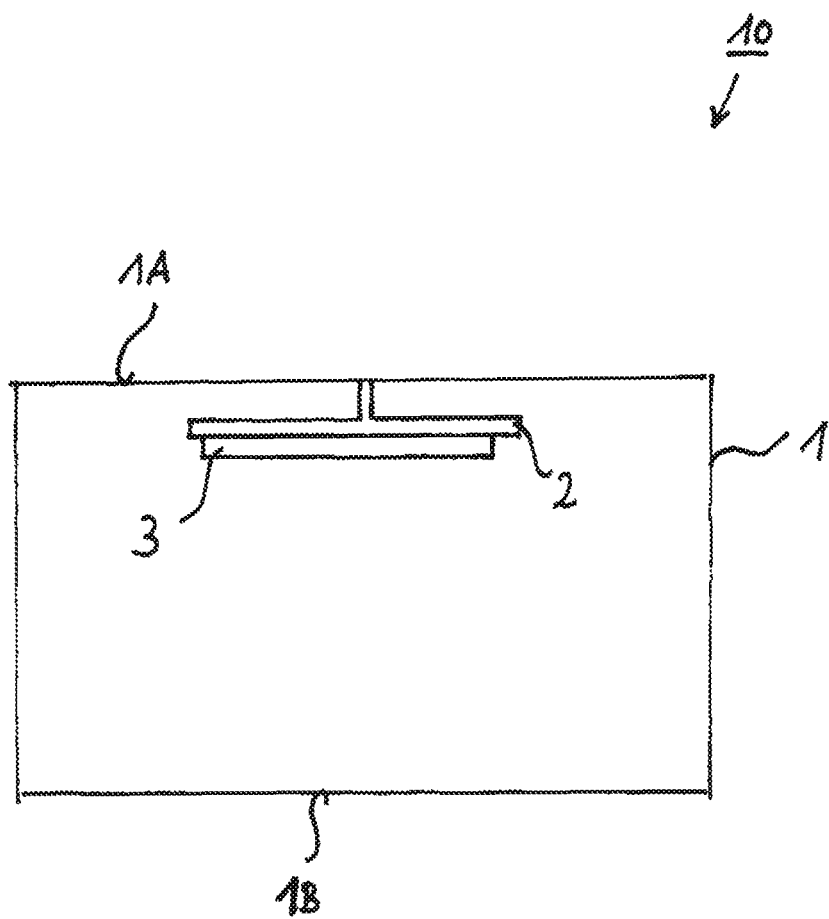
FIG. 1 shows a schematic cross-sectional side view representation of a semiconductor processing system according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Embodiments as described herein comprise processing apparatuses and process reactors. It is to be understood that these processing apparatuses and process reactors virtually enclose all sorts of equipment and devices which are known in the art for conducting any sorts of processes with semiconductor substrates, semiconductor wafers, semiconductor chips and semiconductor dies. In particular, such apparatuses should be mentioned herein in which semiconductor substrates of all kinds can be oxidized, etched, coated with any sort of layer materials or treated with heat, pressure and moisture or annealed with temperature processes. More specifically, those apparatuses are particularly significant in which semiconductor substrates are coated with layers of all kinds by chemical vapor deposition (CVD), plasma-enhanced chemical vapor deposition (PECVD), sputtering and any one of these deposition methods with the assistance of radio frequency excitation.

Referring to FIG. 1, there is shown a schematic cross-sectional side view representation of a semiconductor processing system according to a first aspect. The semiconductor processing system 10 comprises a reactor chamber 1 comprising an upper wall 1A and a lower wall 1B, and a hold member 2 disposed in the reactor chamber 1 to hold a semiconductor substrate 3 in such a way that it faces the lower wall 1B of the reactor chamber 1.

The way of processing the semiconductor substrate may be described with the term "upside down wafer processing". This upside down wafer processing will reduce or even eliminate deposition of particles, defects, flakes, etc., on the semiconductor substrate. Due to simple gravitational forces the particles, defects and flakes will not tend to remain on the semiconductor substrate surface but will fall down so that they can be taken along by any sort of flowing process gas or plasma in the direction of an outlet opening of the reactor chamber. Several further embodiments may assist the process of removing particles, defects and flakes as will be shown later.

According to an embodiment of the semiconductor processing system 10, the semiconductor processing system 10 is configured such that in an upright standing position of the reactor chamber 1 for its intended use the semiconductor substrate faces the lower wall of the reactor chamber, in particular the exposed surface of the semiconductor substrate is directed downwards to the lower wall of the reactor chamber. According to an embodiment thereof, the hold member is disposed in an upper half of the reactor chamber.

According to an embodiment of the semiconductor processing system 10, the upper wall 1A comprises an inlet opening and the lower wall 1B comprises an outlet opening. The inlet opening may be connected to a process gas reservoir whereas the outlet opening may be connected to an exhaust pump.

According to an embodiment of the semiconductor processing system 10, a plasma generation unit (not shown) is coupled to the reactor chamber. More specifically, the plasma generation unit is coupled to an inlet opening formed in the upper wall 1A of the reactor chamber 1.

According to an embodiment of the semiconductor processing system 10, the hold member 2 is comprised of a wafer chuck. The wafer chuck can be constructed as known in the art, in particular by comprising a plurality of through-conduits leading to openings at a surface of the wafer chuck so that a semiconductor wafer can be sucked onto the surface of the wafer chuck by applying a vacuum to the through-conduits.

According to an embodiment of the semiconductor processing system 10, a radio frequency unit is connected to the hold member. More specifically, it can be connected in such a way to the hold member that an electrical conduction line between the radio frequency unit and the hold member is fed through an opening in the upper wall 1A of the reactor chamber 1. Moreover, the hold member 2 may comprise a first main surface to hold the semiconductor substrate 3 thereupon and a second main surface opposite to the first main surface, wherein the radio frequency generator unit is connected to the second main surface of the hold member.

According to an embodiment of the semiconductor processing system 10, the system further comprises a magnet to distract material fragments or particles released from the semiconductor substrate 3. The magnet can be disposed outside the reactor chamber. Moreover, the magnet can be disposed such that one of the poles (N or S) of the magnet is facing the exposed surface of the semiconductor substrate 3.

A second aspect is related to a semiconductor processing apparatus, comprising a process chamber, a hold member disposed in the process chamber to hold a semiconductor substrate so that an exposed surface of the semiconductor substrate can be processed, wherein the processing apparatus is configured so that in an upright standing position of the processing apparatus the exposed surface of the semiconductor substrate is directed downwards.

Embodiments of the second aspect can be formed in connection with any feature or embodiment as described above in connection with the first aspect.

In the following further embodiments of a semiconductor processing system will be described. The description of those features described above in connection with FIG. 1 and carrying the same reference numerals will not be repeated.

Figure 2:
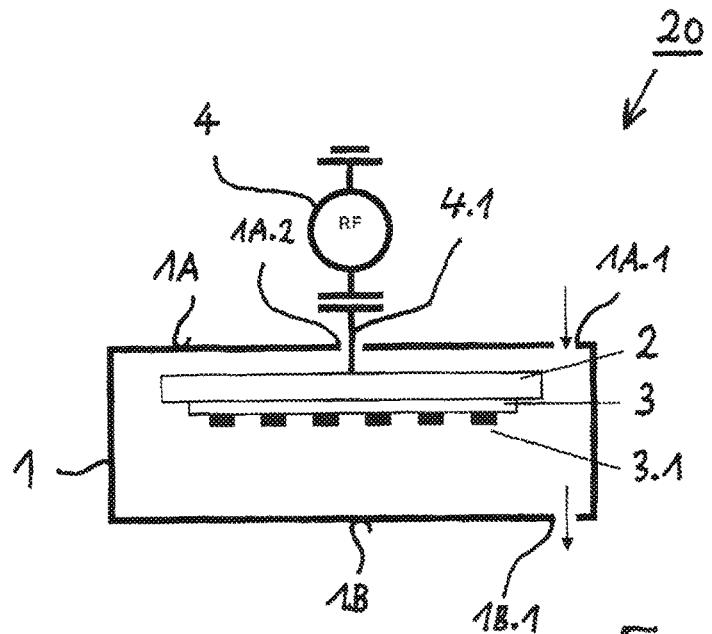
FIG. 2 shows a schematic cross-sectional side view representation of a semiconductor processing system according to an embodiment.

Referring to FIG. 2, there is shown a schematic cross-sectional side view representation of a semiconductor processing system according to an embodiment. The semiconductor processing system 20 comprises in the upper wall 1A of the reactor chamber 1 an inlet opening 1A.1 connected with a process gas reservoir (not shown) and in the lower wall 1B an outlet opening 1B.1 connected with an exhaust pump (not shown). In addition there is provided a radio frequency unit 4 for generating a radio frequency signal and feeding the radio frequency signal via an electrical connection line 4.1 to the hold member 2. The hold member 2 is preferably comprised of a wafer chuck. The electrical connection line 4.1 is fed through an opening 1A.2 of the upper wall 1A of the reactor chamber 1. The silicon wafer 3 is shown to have structures 3.1 to be removed, e.g. by etching. A specific example will be shown later.

Figure 3:
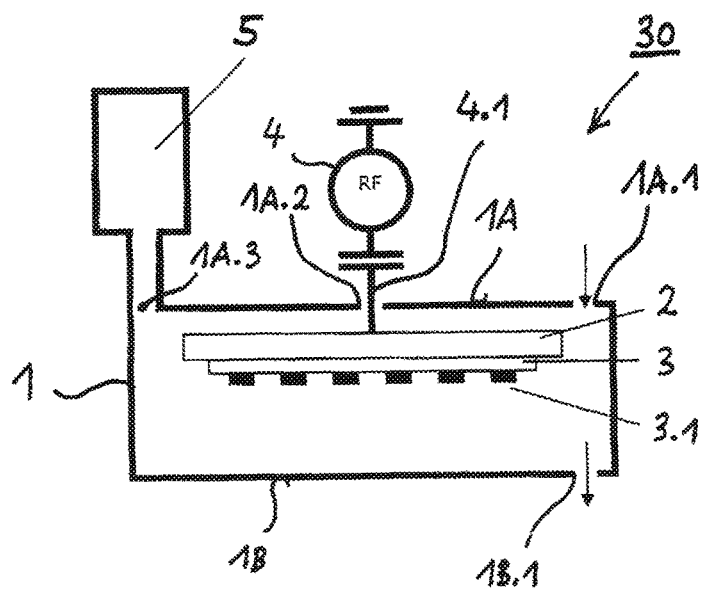
FIG. 3 shows a schematic cross-sectional side view representation of a semiconductor processing system according to an embodiment.

Referring to FIG. 3, there is shown a schematic cross-sectional side view representation of a semiconductor processing system according to an embodiment. The semiconductor processing system 30 comprises in addition to that one shown in FIG. 2 a plasma generation unit 5 coupled to the reactor chamber 1. In the plasma generation unit 5 a plasma is generated either by microwave excitation or by transformer (i.e., inductively) coupled plasma generation and fed into the reactor chamber 1 through a further inlet opening 1A.3 in the upper wall 1A of the reactor chamber 1.

Figure 4:
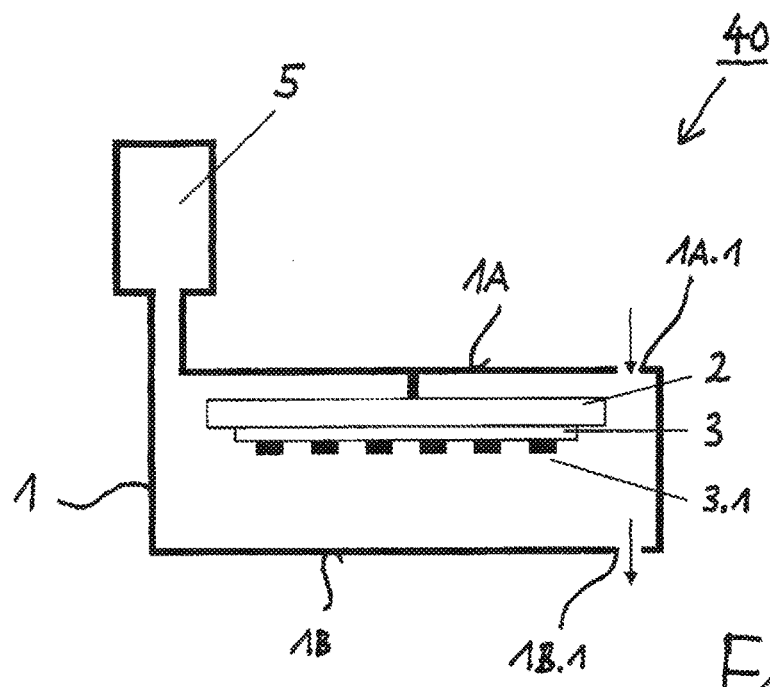
FIG. 4 shows a schematic cross-sectional side view representation of a semiconductor processing system according to an embodiment.

Referring to FIG. 4, there is shown a schematic cross-sectional side view representation of a semiconductor processing system according to an embodiment. The semiconductor processing system 40 of FIG. 4 differs from that one shown in FIG. 3 only in that the radio frequency unit 4 is omitted. Instead the hold member 2 is directly mechanically fixed at the upper wall 1A.

Figure 5:
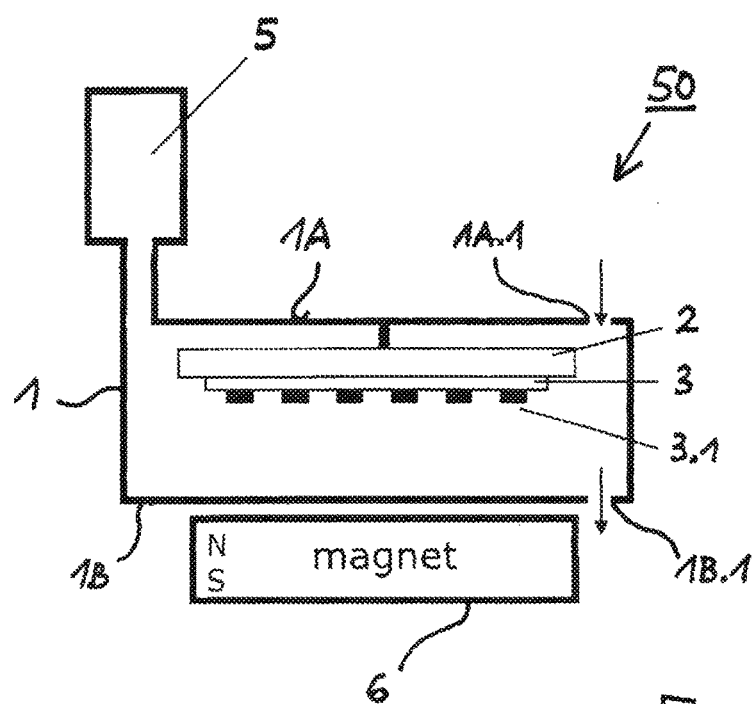
FIG. 5 shows a schematic cross-sectional side view representation of a semiconductor processing system according to an embodiment.

Referring to FIG. 5, there is shown a schematic cross-sectional side view representation of a semiconductor processing system according to an embodiment. The semiconductor processing system 50 of FIG. 5 differs from that one shown in FIG. 4 only in that a magnet 6 is disposed below the reactor chamber 1. The magnet 6 can be either a permanent magnet or an electro magnet. The purpose of the magnet 6 is to distract particles from the semiconductor wafer 3 so that they can easily be pumped out of the reactor chamber 1. In the embodiment of FIG. 5 the north pole of the magnet 6 faces the semiconductor substrate 3.

Figure 6:
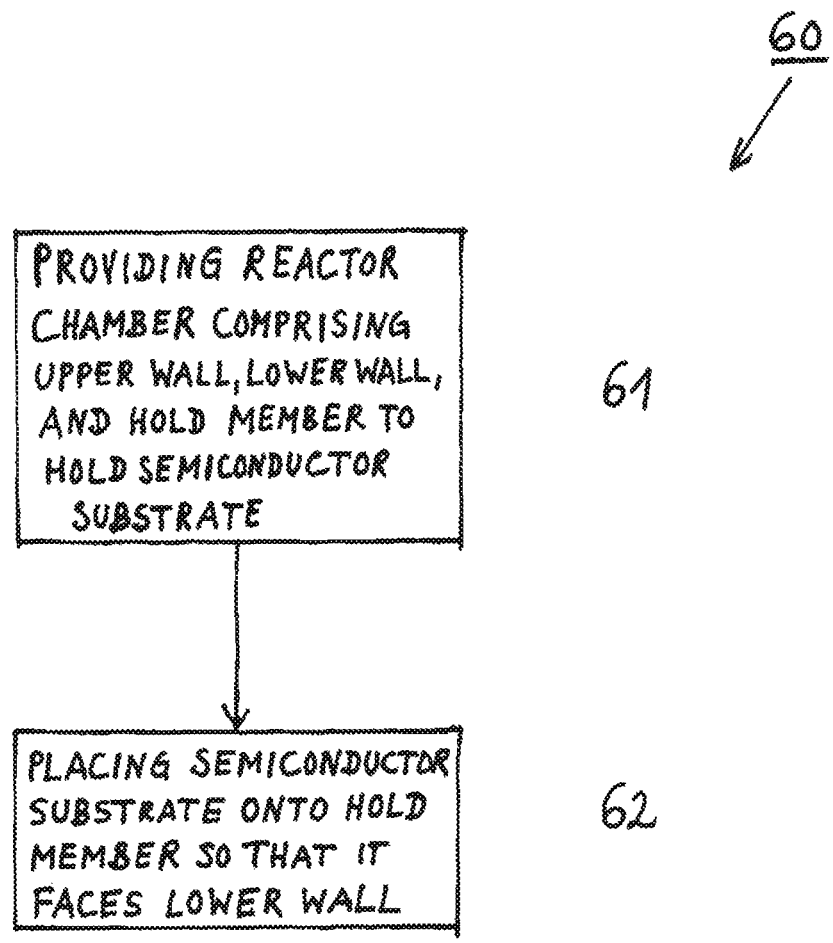
FIG. 6 shows a flow diagram for illustrating a method for processing a semiconductor substrate according to an embodiment.

Referring to FIG. 6, there is shown a flow diagram for illustrating a method for processing a semiconductor substrate according to an embodiment. The method 60 comprises providing a reactor chamber comprising an upper wall and a lower wall and a hold member to hold a semiconductor substrate to be processed (61), and placing the semiconductor substrate onto a hold member in such a way that it faces the lower wall of the reactor chamber (62).

According to an embodiment of the method 60, the method 60 further comprises feeding a process gas into the reactor chamber.

According to an embodiment of the method 60, the method 60 further comprises feeding a radio frequency signal into the reactor chamber, in particular to the hold member.

According to an embodiment of the method 60, the method 60 further comprises feeding a plasma gas into the reactor chamber.

According to an embodiment of the method 60, the method 60 further comprises removing structures from an exposed surface of the semiconductor substrate, in particular by isotropic etching or ashing.

According to an embodiment of the method 60, the method 60 further comprises pumping out materials or media through an outlet opening of the reactor chamber.

According to an embodiment of the method 60, the reactor chamber is provided such that the hold member is disposed in an upper half of the reactor chamber.

Figure 7A:
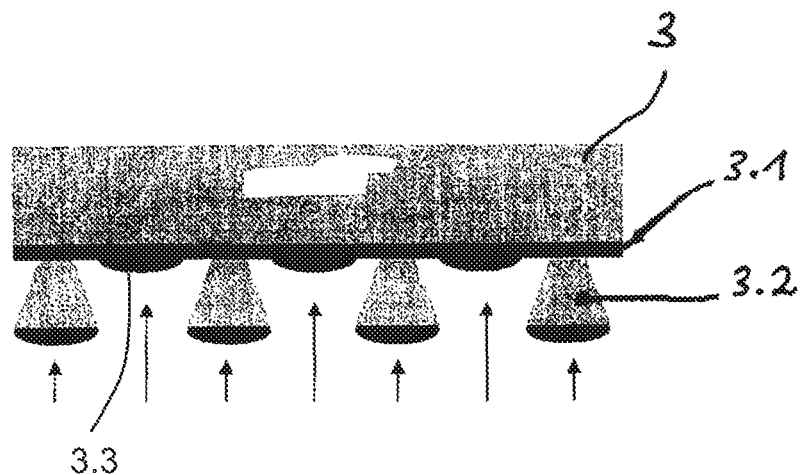
FIGS. 7a and 7b show schematic cross-sectional side view representations for illustrating an embodiment of the removal of material by upside down wafer processing.
Figure 7B:
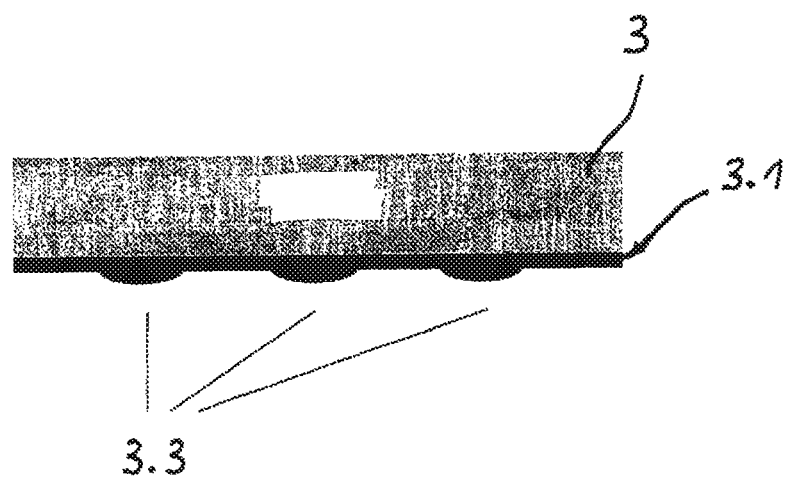

FIGS. 7*a* and 7*b* show schematic cross-sectional side view representations to illustrate an example for a structure or material to be removed by upside down wafer processing. FIG. 7*a* shows a silicon wafer 3 carrying a film 3.1 that is to be patterned. For that purpose an organic film 3.2 is deposited onto the film 3.1 and structured thereafter in order to form a mask pattern. Thereafter a hard mask film 3.3 is deposited onto the organic film 3.2 and the film 3.1 as indicated by the arrows resulting in the intermediate product shown in FIG. 7*a*. Thereafter the overhang structures have to be removed which is at best performed by upside down wafer processing as described in the aspects of this application. The removal can be performed by isotropic etching or ashing. FIG. 7*b* shows the result in the form of a structured hard mask 3.3 (e.g., Ni) so that in a further step the film 3.1 can be patterned.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for processing a semiconductor substrate, the method comprising:
    providing a reactor chamber comprising an upper wall and a lower wall and a hold member to hold a semiconductor substrate to be processed;
    placing the semiconductor substrate onto the hold member in such a way that it faces the lower wall of the reactor chamber;
    disposing a magnet outside the reactor chamber such that a pole of the magnet is facing an exposed surface of the semiconductor substrate to distract material fragments or particles released from the semiconductor substrate; and
    processing the semiconductor substrate including taking away one or more of particles, defects and flakes that have fallen down from the semiconductor substrate due to gravitational or magnetic forces, by any sort of flowing process gas or plasma in the direction of an outlet opening.

2. The method according to claim 1, further comprising: feeding a process gas into the reactor chamber.

3. The method according to claim 1, further comprising: feeding a plasma gas into the reactor chamber.

\* \* \* \* \*